United States Patent
Braun et al.

(10) Patent No.: US 9,893,146 B1
(45) Date of Patent: Feb. 13, 2018

(54) LATERAL DMOS AND THE METHOD FOR FORMING THEREOF

(71) Applicant: Monolithic Power Systems, Inc., San Jose, CA (US)

(72) Inventors: Eric Braun, Mountain View, CA (US); Joel McGregor, San Jose, CA (US); Jeesung Jung, San Ramon, CA (US); Ji-Hyoung Yoo, Cupertino, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 23 days.

(21) Appl. No.: 15/285,315

(22) Filed: Oct. 4, 2016

(51) Int. Cl.
| | |
|---|---|
| *H01L 29/76* | (2006.01) |
| *H01L 29/06* | (2006.01) |
| *H01L 29/78* | (2006.01) |
| *H01L 29/10* | (2006.01) |
| *H01L 29/66* | (2006.01) |
| *H01L 21/265* | (2006.01) |

(52) U.S. Cl.
CPC ...... *H01L 29/063* (2013.01); *H01L 21/26513* (2013.01); *H01L 29/1095* (2013.01); *H01L 29/66681* (2013.01); *H01L 29/7816* (2013.01)

(58) Field of Classification Search
CPC ............... H01L 29/063; H01L 29/1095; H01L 29/66681; H01L 29/7816; H01L 29/402; H01L 29/0649; H01L 29/0653; H01L 21/26513
USPC .................................................. 257/335, 339
See application file for complete search history.

(56) References Cited

U.S. PATENT DOCUMENTS

| | | | |
|---|---|---|---|
| 8,198,679 B2 | 6/2012 | Yoo | |
| 8,664,067 B2 | 3/2014 | Disney | |
| 8,759,912 B2 | 6/2014 | Disney et al. | |
| 8,772,867 B2 | 7/2014 | Yoo et al. | |
| 8,796,100 B2 | 8/2014 | Jung | |
| 8,916,913 B2 | 12/2014 | Yoo et al. | |
| 8,922,963 B2 | 12/2014 | Braun | |
| 9,041,102 B2 | 5/2015 | McGregor | |
| 9,087,774 B2 | 7/2015 | Jung et al. | |
| 9,159,795 B2 | 10/2015 | Yoo et al. | |
| 9,245,647 B2 | 1/2016 | Braun et al. | |
| 9,362,351 B2 | 6/2016 | Ma et al. | |
| 2008/0093641 A1* | 4/2008 | Ludikhuize | H01L 29/0634 257/289 |
| 2015/0243778 A1* | 8/2015 | Okawa | H01L 29/1095 257/343 |

(Continued)

OTHER PUBLICATIONS

U.S. Appl. No. 13/072,569, filed Mar. 25, 2011, Monolithic Power Systems.

(Continued)

*Primary Examiner* — Kevin M Picardat
(74) *Attorney, Agent, or Firm* — Perkins Coie LLP

(57) ABSTRACT

A lateral DMOS device with peak electric field moved below a top surface of the device along a body-drain junction is introduced. The LDMOS has a deep body and a drift region formed by a series of P-type and N-type implants, respectively. The implant doses and depths are tuned so that the highest concentration gradient of the body-drift junction is formed below the surface, which suppresses the injection and trapping of hot holes in the device drain-gate oxide region vicinity, and the associated device performance changes, during operation in breakdown.

12 Claims, 6 Drawing Sheets

(56) References Cited

U.S. PATENT DOCUMENTS

2015/0255596 A1* 9/2015 Cai ................... H01L 29/6659
257/337
2015/0295081 A1* 10/2015 Matsuda ............ H01L 29/7816
257/339

OTHER PUBLICATIONS

U.S. Appl. No. 13/931,700, filed Jun. 28, 2013, Monolithic Power Systems.
U.S. Appl. No. 13/427,658, filed Mar. 22, 2012, Chengdu Monolithic Power Systems.
U.S. Appl. No. 14/970,537, filed Dec. 15, 2015, Monolithic Power Systems.
U.S. Appl. No. 14/106,421, filed Dec. 13, 2013, Monolithic Power Systems.
U.S. Appl. No. 14/869,745, filed Sep. 29, 2015, Monolithic Power Systems.

* cited by examiner

LATERAL DMOS AND THE METHOD FOR FORMING THEREOF

FIELD

The present invention relates to semiconductor devices, more specifically, the present invention relates to LDMOS (Lateral Diffused Metal Oxide Semiconductor) devices.

BACKGROUND

FIG. 1 schematically shows a cross-section view of a typical LDMOS. At high voltage applications, when the drain-source voltage exceeds the avalanche breakdown voltage of the device, electron-hole pairs are typically nucleated in the area of high electric field impact ionization under the gate termination in the drift region at the silicon surface. Electrons go to the highest potential, out the N+ drain contact; holes go to the lowest potential, out the P+ body contact, as shown (avalanche hole path 11; avalanche electron path 12) in FIG. 1.

Additionally, at zero and low gate to source bias, some of the avalanche generated hot holes will be injected into the gate oxide and/or spacer regions near the surface peak electric field point; some of which may become trapped resulting in a local reduction of the surface peak field and increase of the breakdown voltage; this phenomenon is well known as walk-out.

Besides increasing the breakdown voltage, the change in the surface potential associated with walk-out is typically also associated with other device performance changes including change in the on-state resistance. Such changes (e.g. the change in the on-state resistance) in device performance dependent on the device operation beyond breakdown are generally undesirable for practical usage.

SUMMARY

It is an object of the present invention to provide an improved LDMOS, which solves the above problems.

In accomplishing the above and other objects, there has been provided, in accordance with an embodiment of the present invention, a semiconductor device, comprising: a gate region formed on a top surface of the semiconductor device; an N-type drain region comprising a drift region and a highly doped drain contact region formed in the drain region, the drain contact region being at a first side of the gate region, the drift region including an upper sub-drift region, a middle sub-drift region and a lower sub-drift region, the upper sub-drift region, the middle sub-drift region and the lower sub-drift region being with different doping concentration with each other, and arranged vertically from the top surface of the semiconductor device to a substrate of the semiconductor device, respectively, and a P-type deep body region having an N-type highly doped source region and a P-type highly doped body contact region formed therein, the body contact region and the majority portion of the source region being at a second side of the gate region.

In addition, there has been provided, in accordance with an embodiment of the present invention, a method for forming a semiconductor device, comprising: forming an N-type well region in a layer grown on a semiconductor substrate by implanting a series of N-type dopants with varying doping concentration; forming a gate region on a top surface of the layer; forming a P-type deep body region in the layer; and forming an N-type highly doped drain contact region in the N-type well region, forming an N-type highly doped source region and a P-type highly doped body contact region in the body region, the drain contact region being at a first side of the gate region, the body contact region and the majority portion of the source region being at a second side of the gate region.

Furthermore, there has been provided, in accordance with an embodiment of the present invention, a semiconductor device, comprising: a gate region formed on a top surface of the semiconductor device; an N-type drain region comprising a drift region and a highly doped drain contact region formed in the drain region, the drain contact region being at a first side of the gate region, the drift region being formed by a series of N-type dopants with doping concentration varying vertically from the top surface of the semiconductor device to a substrate of the semiconductor device; and a P-type deep body region having an N-type highly doped source region and a P-type highly doped body contact region formed therein, the source region and the body contact region being adjacent to each other, the body contact region and the majority of the source region being at a second side of the gate region.

The use of the similar reference label in different drawings indicates the same of like components.

DETAILED DESCRIPTION

Embodiments of cross-section views for LDMOS are described in detail herein. In the following description, some specific details, such as example circuits for these circuit components, are included to provide a thorough understanding of embodiments of the invention. One skilled in relevant art will recognize, however, that the invention can be practiced without one or more specific details, or with other methods, components, materials, etc.

The following embodiments and aspects are illustrated in conjunction with circuits and methods that are meant to be exemplary and illustrative. In various embodiments, the above problem has been reduced or eliminated, while other embodiments are directed to other improvements.

Figure 2:
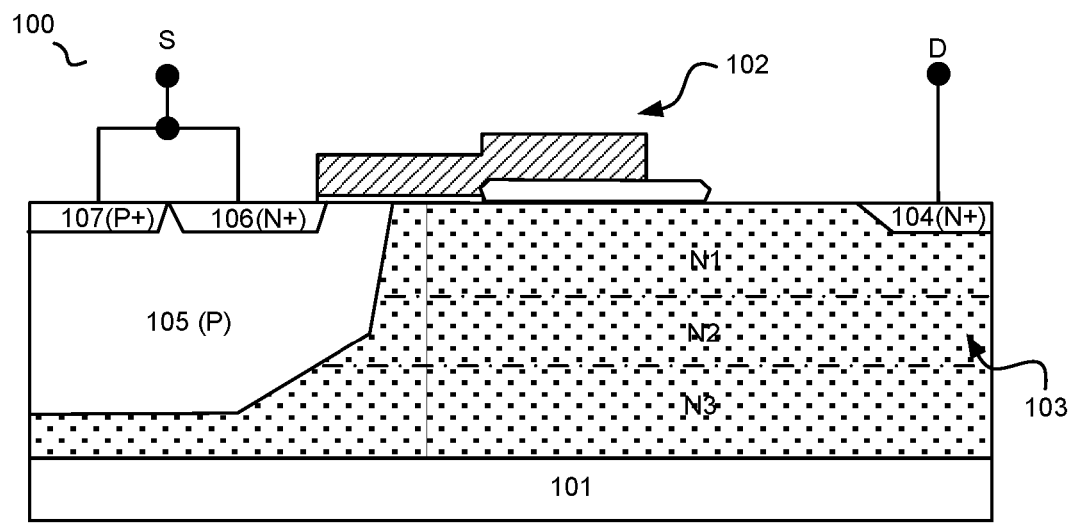
FIG. 2 schematically shows a cross-section view of a LDMOS 100 in accordance with an embodiment of the present invention.

FIG. 2 schematically shows a cross-section view of a LDMOS 100 in accordance with an embodiment of the present invention. In the example of FIG. 2, the LDMOS 100 comprises: a gate region 102 formed on a top surface of the semiconductor device 100; an N-type drain region comprising a drift region 103 (dotted region) and a highly doped drain contact region 104 formed in the drain region, the drain contact region 104 being at a first side of the gate region 102; and a P-type deep body region 105 having an N-type highly doped source region 106 and a P-type highly doped body contact region 107 formed therein, the body contact region 107 and majority portion of the source region 106 being at a second side of the gate region 102. The drift region 103 comprises an upper sub-drift region N1, a middle sub-drift region N2 and a lower sub-drift region N3, the upper sub-drift region N1, the middle sub-drift region N2 and the lower sub-drift region N3 being with different doping concentration with each other, and arranged (or disposed) vertically from the top surface of the semiconductor device 100 to a substrate 101 of the semiconductor device 100, respectively. The middle sub-drift region N2 has the highest doping concentration, and the doping concentration decreases both from the middle sub-drift region N2 to the upper sub-drift region N1, and from the middle sub-drift region N2 to the lower sub-drift region N3. That is, the upper sub-drift region N1 has lower doping concentration than the middle sub-drift region N2, and the middle sub-drift region N2 has higher doping concentration than the lower sub-drift region N3.

In the embodiment of FIG. 2, a substrate region 101, a source electrode (S) contacted with source region 106 and the body contact region 107, and a drain electrode (D) contacted with the drain contact region 104 are also shown.

Figure 3:
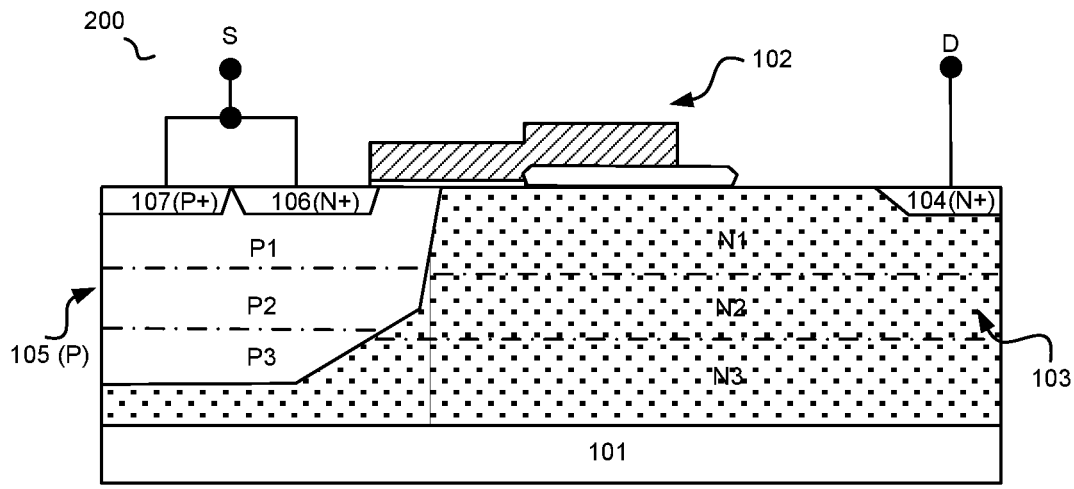
FIG. 3 schematically shows the avalanche hole path 23 of the LDMOS 100 in FIG. 2.

FIG. 3 schematically shows a cross-section view of a LDMOS 200 in accordance with an embodiment of the present invention. In the example of FIG. 3, the body region 105 comprises an upper sub-body region P1, a middle sub-body region P2 and a lower sub-body region P3, wherein the upper sub-body region P1, the middle sub-body region P2 and the lower sub-body region P3 are with different doping concentration with each other, and are arranged vertically from the top surface of the semiconductor device 200 to a bottom edge of the body region 105. The middle sub-body region P2 has the highest doping concentration, and the doping concentration decreases both from the middle sub-body region P2 to the upper sub-body region P1, and from the middle sub-body region P2 to the lower sub-body region P3. That is, the upper sub-body region P1 has lower doping concentration than the middle sub-body region P2, and the middle sub-body region P2 has higher doping concentration than the lower sub-body region P3.

Figure 4:
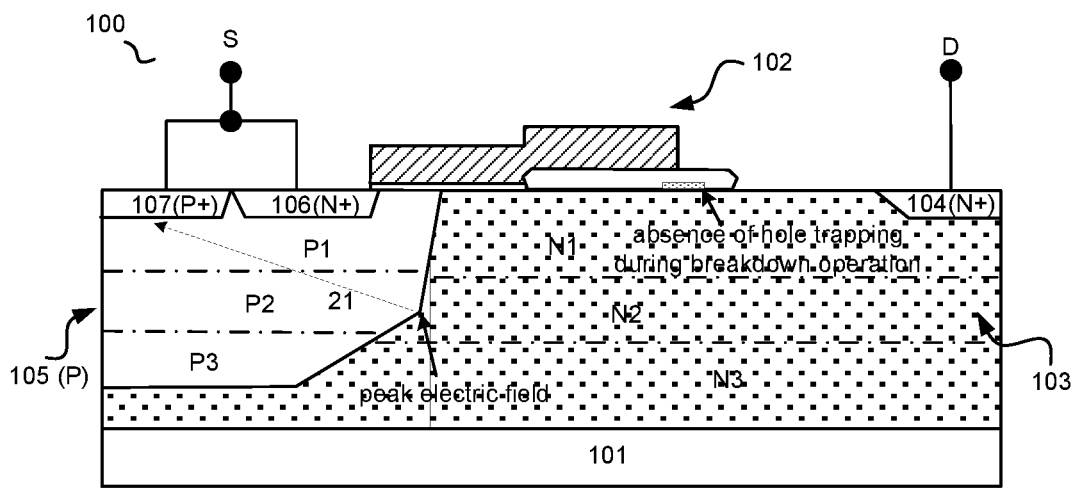
FIG. 4 schematically shows a cross-section view of a LDMOS 200 in accordance with an embodiment of the present invention.

For illustration purpose, FIG. 4 schematically shows the avalanche hole path (dash line 23) of the LDMOS 200 in FIG. 3. As shown in FIG. 4, because the drift region is formed by a series of N-type implants and the deep body region is formed by a series of P-type implants, each with the middle portion having highest doping concentration, the avalanche hole generation point and path is moved away from the surface of the device, thus suppressing the injection and capture of hot holes in the drain-gate oxide vicinity and associated changes in device performance.

Figure 5:
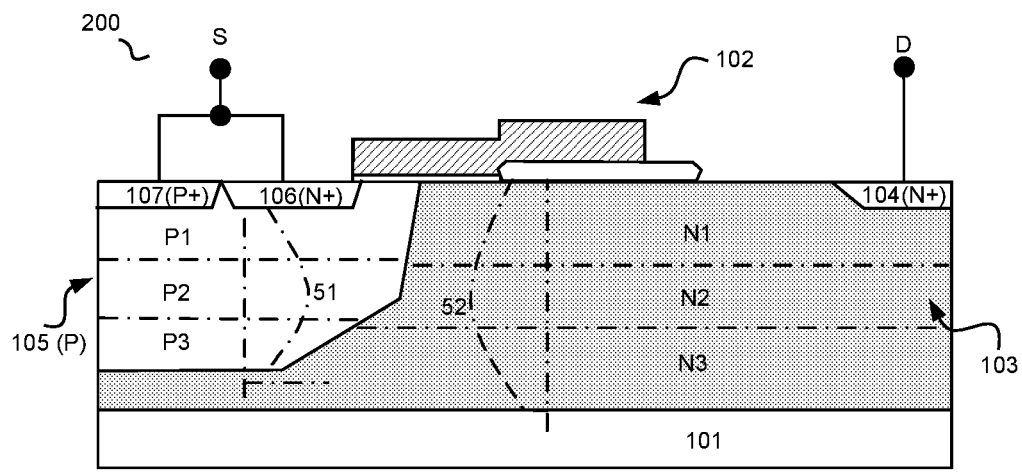
FIG. 5 schematically shows the doping concentration versus the depth of the semiconductor device.

FIG. 5 schematically shows the doping concentration versus the depth of the semiconductor device. Dot dash line 51 represents the waveform of the p-body acceptors doping concentration (horizontal direction) versus the depths of the body region 105 (vertical direction); and dot dash line 52 represents the waveform of the n-drain donors doping concentration (horizontal direction) versus the depths of the drift region (vertical direction). As shown in FIG. 5, the implant doses and depths of the sub-drift regions and sub-body regions are chosen so that the highest concentration gradient of the body-drift junction is moved below the surface.

Figure 6A:
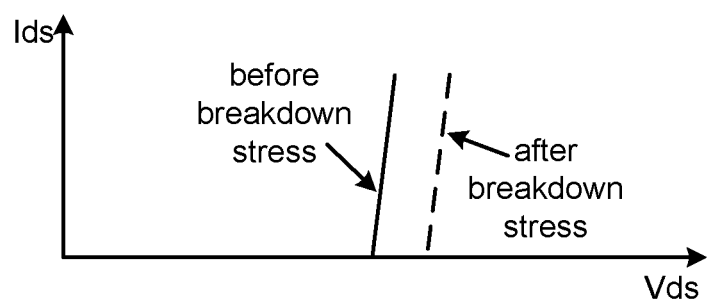
FIG. 6A schematically shows the change in the off state (when the gate-source voltage Vgs=0V) Ids-Vds breakdown voltage characteristic (walk-out) before and after breakdown stress for a typical LDMOS.
Figure 6B:
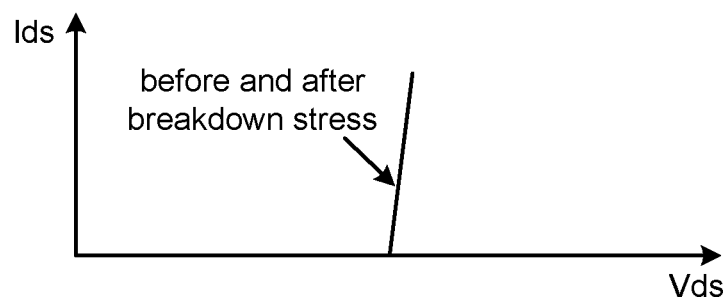
FIG. 6B schematically shows the change in the off state (when the gate-source voltage Vgs=0V) Ids-Vds breakdown voltage characteristic (walk-out) before and after breakdown stress for a LDMOS provided by the present invention.

FIG. 6A schematically shows the change in the off state (when the gate-source voltage Vgs=0V) Ids-Vds breakdown voltage characteristic (walk-out) before and after breakdown stress for a typical LDMOS. FIG. 6B schematically shows the change in the off state (when the gate-source voltage Vgs=0V) Ids-Vds breakdown voltage characteristic (walk-out) before and after breakdown stress for a LDMOS provided by the present invention.

FIGS. 7A-7E schematically show cross-section views of a semiconductor substrate undergoing a process for forming a LDMOS device in accordance with an embodiment of the present invention.

Figure 7A:
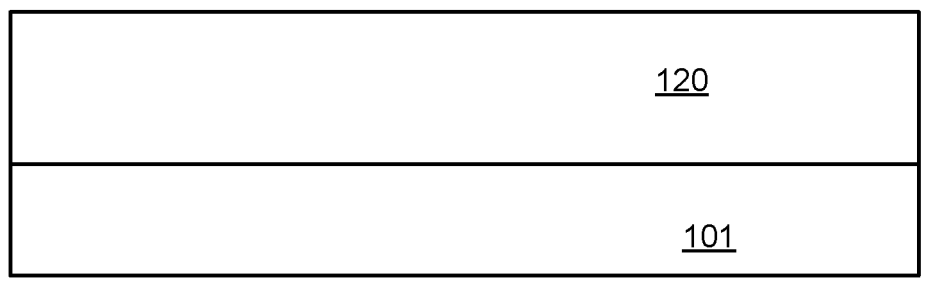
FIGS. 7A-7E partially schematically show cross-section views of a semiconductor substrate undergoing a process for forming a LDMOS device in accordance with an embodiment of the present invention.

As shown in FIG. 7A, the process starts from a silicon wafer top layer 120, which may be formed in an epitaxial layer on the substrate 101. In one embodiment, the epitaxial layer may be formed by deposition technique such as chemical vapor deposition (CVD), plasma enhance chemical vapor deposition (PECVD), atomic layer deposition (ALD), liquid phase epitaxy, and/or other suitable deposition techniques. In another embodiment, the top layer 120 may be simply the surface layer of a single-crystal substrate 101.

Figure 7B:
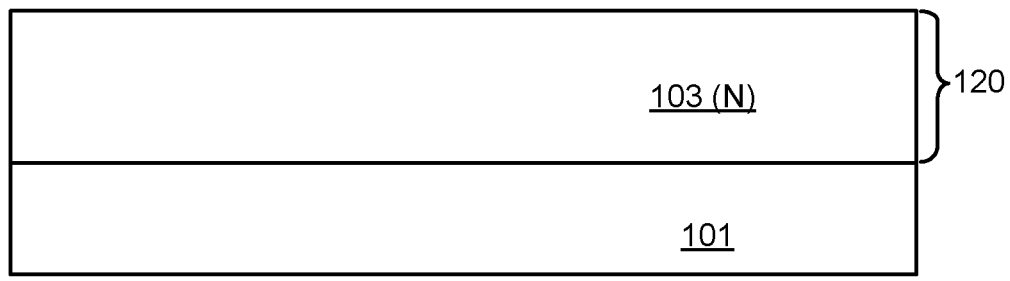

As shown in FIG. 7B, the process includes forming an N-type well region 103 in the layer 120 by implanting a series of N-type dopants, the doping concentration of the series of N-type dopants are tuned in such a way that: portions close to the substrate 101 and close to a top surface of the layer 120 have lower doping concentration than a middle portion of the layer 120.

Figure 7C:
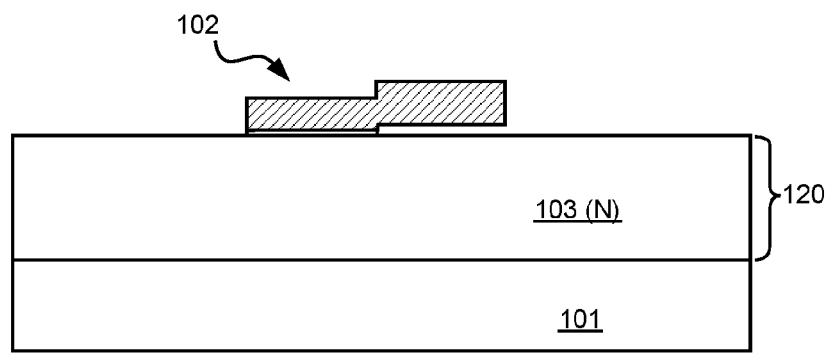

As shown in FIG. 7C, the process includes forming a gate region 102 on the top surface of the layer 120.

Figure 7D:
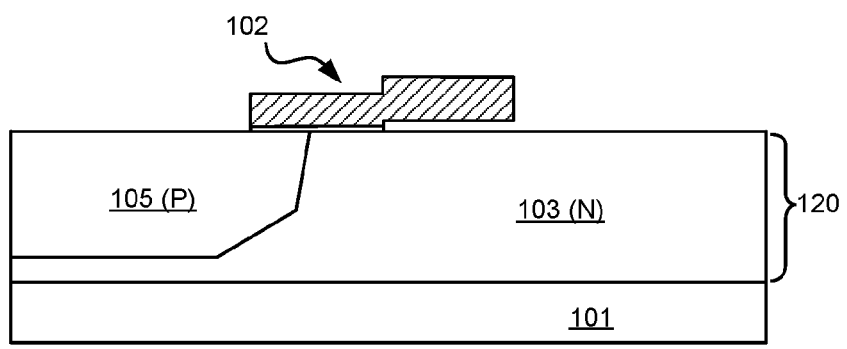

As shown in FIG. 7D, the process includes forming a P-type deep body region 105 in the layer 120. In one embodiment, the body region 105 may be formed by diffusion technology or implantation technology. In one embodiment, the body region 105 is formed by implanting a series of P-type dopants, the doping concentration of the series of P-type dopants are tuned in such a way that: portions close to a bottom edge of the body region 105 and close to a top surface of the body region 105 have lower doping concentration than a middle portion of the body region 105.

Figure 7E:
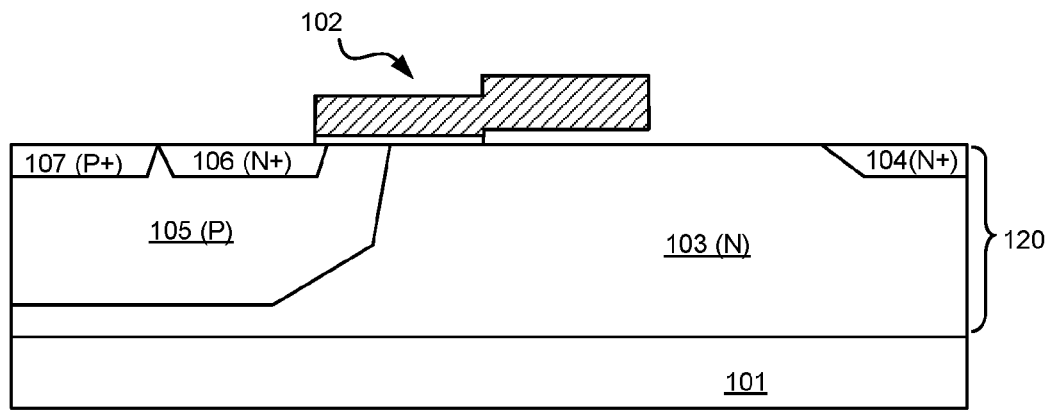

As shown in FIG. 7E, the process includes forming an N-type highly doped drain contact region 104 in the drain region, an N-type highly doped source region 106 and a P-type highly doped body contact region 107 in the body region 105, the drain contact region 104 being at a first side of the gate region 102 (e.g. at right side of the gate region 102 with reference to the shown embodiment), the body contact region 107 and the majority portion of the source region 106 being at a second side of the gate region 102 (e.g. at left side of the gate region 102 with reference to the shown embodiment). The remaining portion of the source region 106 which is not at the second side of the gate region 102 is underneath the gate region 102.

Some other known steps such as forming drain electrode, source electrode, field oxidation and other necessary steps of the LDMOS will not be discussed for ease of illustration.

Figure 8:
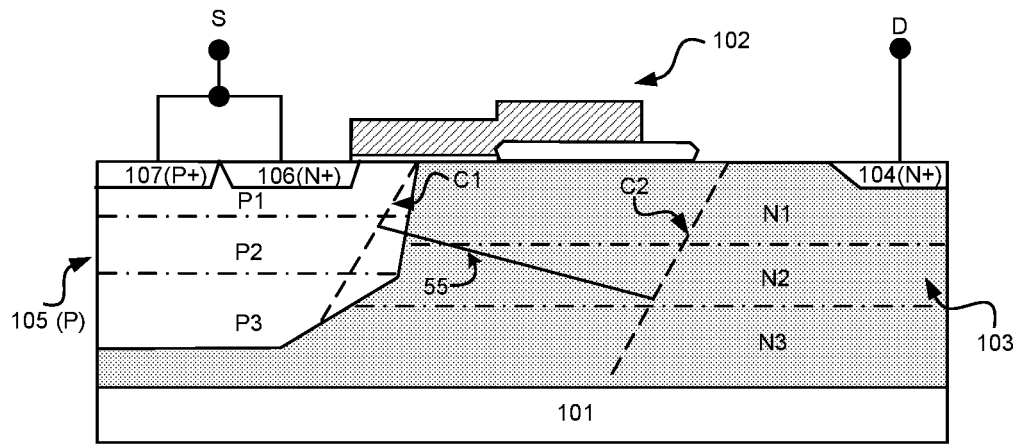
FIG. 8 schematically shows a line segment 55, along which the peak field occurs for a prototypical device construction in accordance with an embodiment of the present invention.

For illustration purpose, FIG. 8 schematically shows a line segment 55, along which the peak field occurs for a prototypical device construction in accordance with an embodiment of the present invention. Line segment 55 connects the peak concentration depths for the middle sub-body region P2 of the body region 105 at approximately 0.15 um depth and the middle sub-drift region N2 of the drift region 103 at approximately 0.55 um depth. As shown in FIG. 8, there also shows cut lines C1 and C2 in the P-type deep body region 105 and the drift region 103, respectively.

Figure 9:
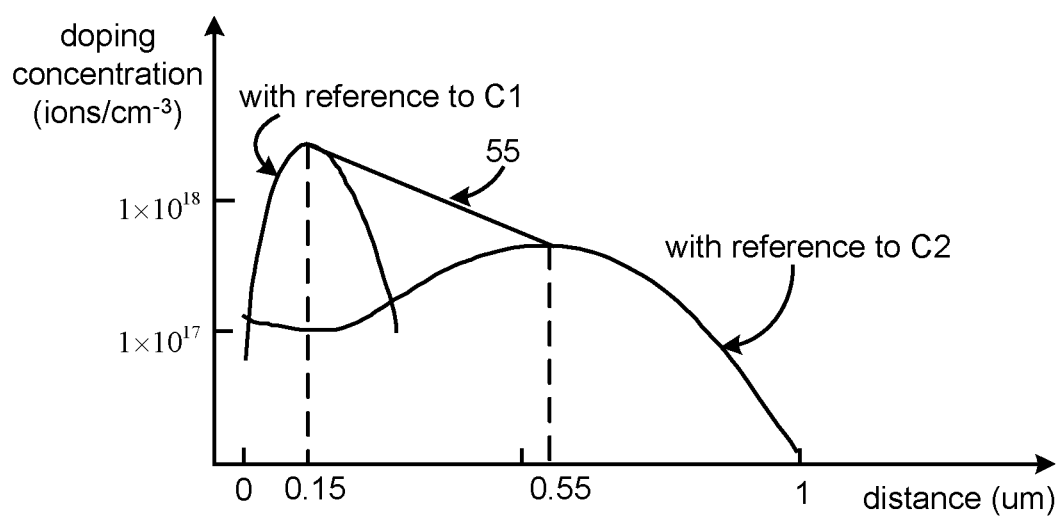
FIG. 9 schematically shows the doping concentration profile of the P-type deep body region 105 versus the distance from the top surface of the semiconductor device with reference to cut line C1, the doping concentration profile of the drift region 103 versus the distance from the top surface of the semiconductor device with reference to cut line C2, and the line segment 55 connecting the peak concentration depths and bisecting the sub-surface peak field point in accordance with an embodiment of the present invention.

FIG. 9 schematically shows the doping concentration profile of the P-type deep body region 105 versus the distance from the top surface of the semiconductor device with reference to cut line C1, the doping concentration profile of the drift region 103 versus the distance from the top surface of the semiconductor device with reference to cut line C2, and the line segment 55 connecting the peak concentration depths and bisecting the sub-surface peak field point in accordance with an embodiment of the present invention. As shown in FIG. 9, in one embodiment, the P-type deep body region 105 has peak doping concentration (higher than $1*10^{18}$ ions/cm$^{-3}$) at around 0.15 um depth (at the middle sub-body region P2), and the drift region 103 has peak doping concentration (between $1*10^{17}$ to $1*10^{18}$ ions/cm$^{-3}$) at around 0.55 um depth (at the middle sub-drift region N2).

Figure 1:
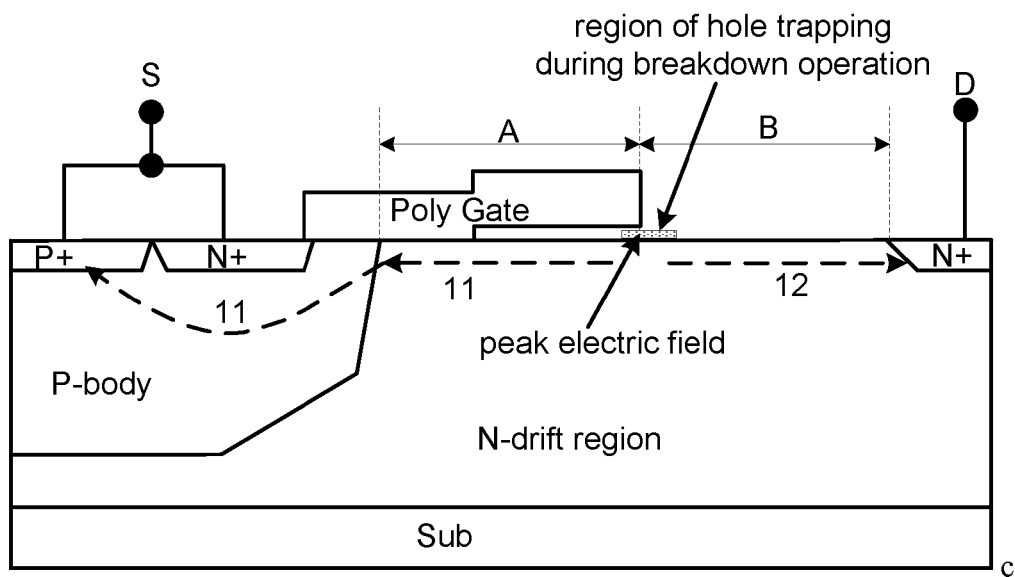
FIG. 1 schematically shows a cross-section view of a typical LDMOS.

Several embodiments of the foregoing LDMOS and the method for forming said LDMOS have been observed to have no walk-out compared to conventional devices similar to the one shown in FIG. 1. Unlike the conventional technique, several embodiments of the foregoing LDMOS comprise a drift region formed by a series of N-type implants and a deep body region formed by a series of P-type implants, thus setting the highest concentration gradient of the body-drift junction (the peak electric field point) at sub-surface position, which suppresses the injection and trapping of hot holes in the device drain-gate oxide region vicinity, and the associated device performance changes, during operation in breakdown.

It is to be understood in these letters patent that the meaning of "lightly doped" or "highly doped" are not restricted to a predetermined doping level.

This written description uses examples to disclose the invention, including the best mode, and also to enable a person skilled in the art to make and use the invention. The patentable scope of the invention may include other examples that occur to those skilled in the art.

What is claimed is:

1. A semiconductor device, comprising:
   a gate region formed on a top surface of the semiconductor device;
   an N-type drain region comprising a drift region and a highly doped drain contact region formed in the drain region, the drain contact region being at a first side of the gate region, the drift region including an upper sub-drift region, a middle sub-drift region and a lower sub-drift region, the upper sub-drift region, the middle sub-drift region and the lower sub-drift region being with different doping concentration with each other, and arranged vertically from the top surface of the semiconductor device to a substrate of the semiconductor device, respectively, wherein the middle sub-drift region has the highest doping concentration, and the doping concentration decreases both from the middle sub-drift region to the upper sub-drift region, and from the middle sub-drift region to the lower sub-drift region; and
   a P-type deep body region having an N-type highly doped source region and a P-type highly doped body contact region formed therein, the body contact region and the majority portion of the source region being at a second side of the gate region.

2. The semiconductor device of claim 1, wherein the body region comprises an upper sub-body region, a middle sub-body region and a lower sub-body region, and wherein the upper sub-body region, the middle sub-body region and the lower sub-body region are with different doping concentration with each other, and are arranged vertically from a top surface of the body region to a bottom edge of the body region, respectively.

3. The semiconductor device of claim 2, wherein the middle sub-body region has the highest doping concentration, and the doping concentration decreases both from the middle sub-body region to the upper sub-body region, and from the middle sub-body region to the lower sub-body region.

4. The semiconductor device of claim 3, wherein the middle sub-body region has a peak doping concentration higher than $1*10^{18}$ ions/cm$^{-3}$, and the middle sub-drift region has a peak doping concentration between $1*10^{17}$ to $1*10^{18}$ ions/cm$^{-3}$.

5. A method for forming a semiconductor device, comprising:
   forming an N-type well region in a layer grown on a semiconductor substrate by implanting a series of N-type dopants with varying doping concentration, wherein the doping concentration of the series of N-type dopants varies in such a way that: the doping concentration of portions close to the semiconductor substrate and close to the top surface of the layer is lower than the doping concentration of a middle portion of the drain region;
   forming a gate region on a top surface of the layer;
   forming a P-type deep body region in the layer; and
   forming an N-type highly doped drain contact region in the N-type well region, forming an N-type highly doped source region and a P-type highly doped body contact region in the body region, the drain contact region being at a first side of the gate region, the body contact region and the majority portion of the source region being at a second side of the gate region.

6. The method of claim 5, wherein the body region is formed by implanting a series of P-type dopants with varying doping concentration.

7. The method of claim 6, wherein the doping concentration of the series of P-type dopants varies in such a way that: the doping concentration of portions close to a bottom edge of the body region and close to a top surface of the body region is lower than the doping concentration of a middle portion of the body region.

8. The method of claim 7, wherein the middle portion of the body region has a peak doping concentration higher than $1*10^{18}$ ions/cm$^{-3}$, and the middle portion of the drain region has a peak doping concentration between $1*10^{17}$ to $1*10^{18}$ ions/cm$^{-3}$.

9. A semiconductor device, comprising:
   a gate region formed on a top surface of the semiconductor device;

an N-type drain region comprising a drift region and a highly doped drain contact region formed in the drain region, the drain contact region being at a first side of the gate region, the drift region being formed by a series of N-type dopants with doping concentration varying vertically from the top surface of the semiconductor device to a substrate of the semiconductor device, wherein portions close to the substrate and close to the top surface of the semiconductor device have lower doping concentration than a middle portion of the drift region; and a P-type deep body region having an N-type highly doped source region and a P-type highly doped body contact region formed therein, the source region and the body contact region being adjacent to each other, the body contact region and the majority of the source region being at a second side of the gate region.

10. The semiconductor device of claim 9, wherein the body region is formed by a series of P-type dopants with doping concentration varying vertically from a top surface of the body region to a bottom edge of the body region.

11. The semiconductor device of claim 10, wherein the body region is formed in such a way that:

portions close to the bottom edge of the body region and close to the top surface of the body region have lower doping concentration than the middle portion of the body region.

12. The semiconductor device of claim 11, wherein the body region has a peaking doping concentration higher than $1*10^{18}$ ions/cm$^{-3}$ at the middle portion, and the drift region has a doping concentration between $1*10^{17}$ to $1*10^{18}$ ions/cm$^{-3}$ at the middle portion.

* * * * *